US005147986A

United States Patent [19]

Cockrum et al.

[11] Patent Number: 5,147,986

[45] Date of Patent: Sep. 15, 1992

[54] SUBWOOFER SPEAKER SYSTEM

[75] Inventors: Lloyd W. Cockrum, Weatherford; Christopher Kline, Bedford, both of Tex.

[73] Assignee: Tandy Corporation, Ft. Worth, Tex.

[21] Appl. No.: 621,498

[22] Filed: Dec. 3, 1990

[51] Int. Cl.[5] .......... H05K 5/00

[52] U.S. Cl. .......... 181/145; 181/156; 181/199

[58] Field of Search .......... 181/144, 145, 148, 150, 181/155, 156, 199, 100

[56] References Cited

U.S. PATENT DOCUMENTS

| | | | |
|---|---|---|---|
| 1,820,996 | 9/1931 | Weil | 181/155 |
| 1,869,178 | 7/1932 | Thuras | 181/155 |
| 1,969,704 | 8/1934 | D'Alton | 181/156 |
| 3,688,864 | 9/1972 | Guss | 181/145 |
| 4,008,374 | 2/1977 | Tiefenbrun | 181/146 |
| 4,016,953 | 4/1977 | Butler | 181/144 |
| 4,549,631 | 10/1985 | Bose | 181/155 |
| 4,598,789 | 7/1986 | Ritter | 181/144 |
| 5,092,424 | 3/1992 | Schreiber et al. | 181/145 |

OTHER PUBLICATIONS

*Speaker Builder*, "An Isobarik System" by John Cockroft, Mar. 1985, pp. 7–11.

*Speaker Builder*, "SB Mailbox", Apr., 1985, p. 52.

*Speaker Builder*, "SB Mailbox", Jan., 1986, pp. 50–52.

*Speaker Builder*, "SB Mailbox", Feb., 1986, p. 46.

*Speaker Builder*, "Kit Report", Jan., 1987, pp. 42–53.

*Speaker Builder*, "SW35 is Not Isobarik", Jan., 1988, p. 54.

*Speaker Builder*, "Tools, Tips & Techniques", Mar., 1989, pp. 56–69.

*Speaker Builder*, "Ultimate Isobarik", Feb., 1990, p. 60.

*Primary Examiner*—L. T. Hix

*Assistant Examiner*—Khanh Dang

*Attorney, Agent, or Firm*—Townsend and Townsend

[57] ABSTRACT

A subwoofer system for providing acoustic energy is provided. The subwoofer or full-range speaker enclosure is divided into at least three chambers. A first speaker acoustically couples the first chamber with the third chamber. A second speaker acoustically couples the second chamber with the third chamber. A first port acoustically couples the first chamber to the exterior of the enclosure. A second port acoustically couples the second chamber to either the first chamber or the exterior of the enclosure. The speakers are driven out-of-phase with respect to the third chamber so as to maintain the third chamber in a substantially constant-pressure state.

34 Claims, 10 Drawing Sheets

SUBWOOFER SPEAKER SYSTEM

BACKGROUND OF THE INVENTION

The present invention relates to a speaker system and, particularly, to a system having at least two chambered speakers acoustically coupled to a third chamber.

Speakers for high-fidelity sound reproduction are commonly divided into high-frequency tweeter speakers, mid-range speakers, and low-frequency woofer or subwoofer speakers. Early high-fidelity woofer speaker systems employed large speaker enclosures. A number of woofer and subwoofer speaker systems have been devised which are intended to provide acoustic power and fidelity comparable to woofers having large enclosures, but which require a smaller space. Previous devices have included simple porting, bass reflex, and independent baffle configurations. One example of a ported system is included in U.S. Pat. No. 4,549,631, issued Oct. 29, 1985, to Bose, which discloses an enclosure with an interior baffle which carries a woofer, the baffle dividing the interior into first and second subchambers with each subchamber having a port tube coupling the subchamber to the region outside the enclosure.

SUMMARY OF THE INVENTION

The present invention includes the recognition of various problems found in previous designs. Previous designs have not satisfactorily provided a small-volume woofer or subwoofer enclosure or a small-volume enclosure for a full range speaker system having a woofer or subwoofer which efficiently produces high-fidelity, low-frequency acoustic energy using multiple drivers. Previous devices have typically required provision of a crossover network.

The present invention involves mounting two separately chambered drivers in an enclosure so that a third, substantially constant-pressure volume is defined. The chamber of one chambered driver is ported to the exterior, and the chamber of the other chambered driver is ported either to the first chamber or to the exterior of the enclosure. The drivers are driven out of phase with respect to the third chamber to maintain the third chamber in a substantially constant-pressure state. Left and right stereo signals fed to the two drivers are summed in the frequency range where they are substantially identical. The chambers have unequal volumes, and the ports have resonant frequencies approximately one octave apart. The configuration produces an effective acoustic bandpass enclosure which can eliminate the need for a crossover network for the subwoofer drivers. The configuration is especially capable of producing high-fidelity, low-frequency sound using an enclosure which occupies less than about 1.0 ft.$^3$, preferably about 0.70 ft.$^3$ (about 0.02 m$^3$).

The present invention also includes incorporating a subwoofer system, as described above, in a full-range speaker system, such as a system including subwoofer, midrange and tweeter drivers, preferably in a single enclosure.

DETAILED DESCRIPTION OF THE PREFERRED EMBODIMENTS

Figure 1:
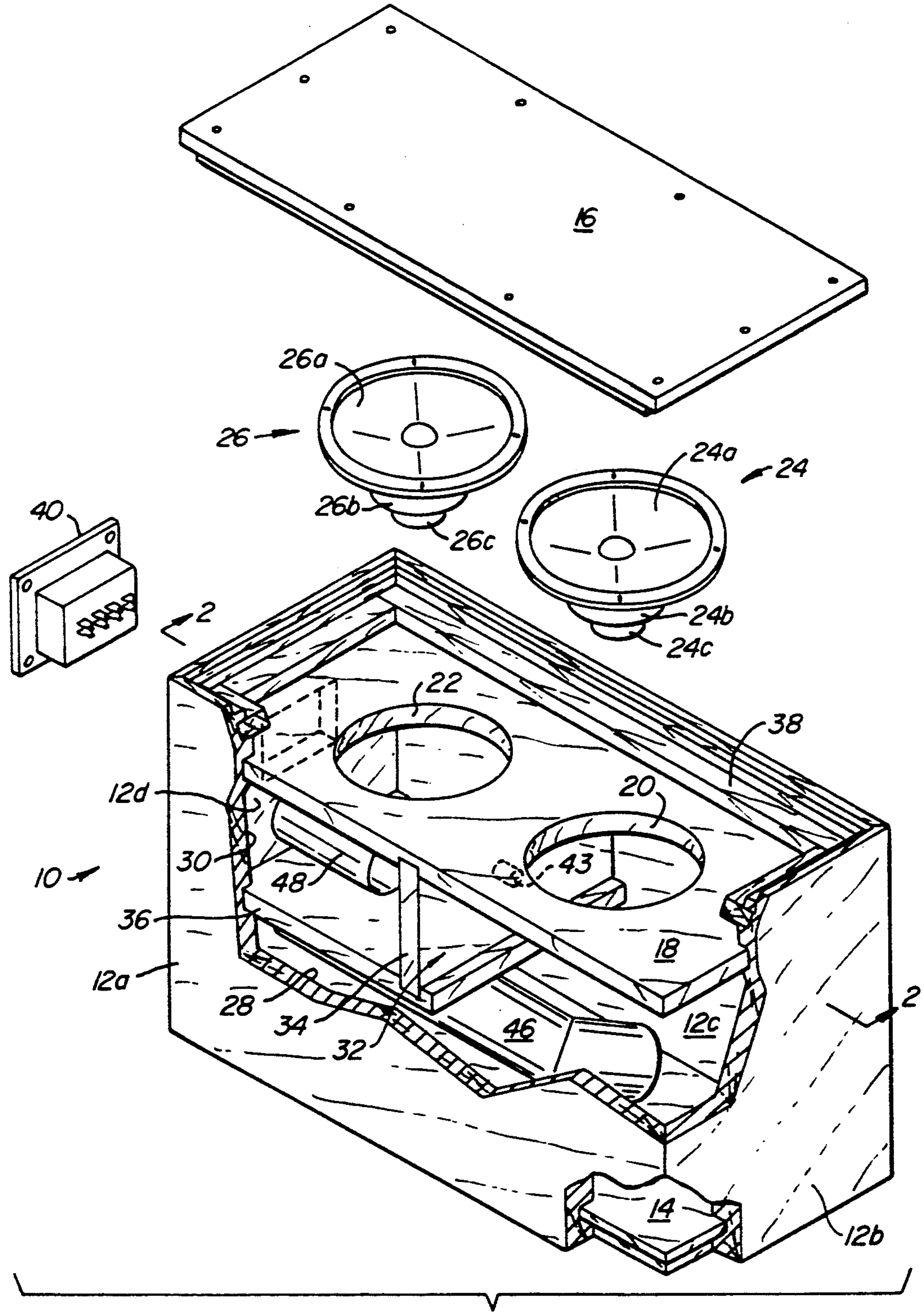
FIG. 1 is an exploded perspective view of a subwoofer according to the present invention.
Figure 2:
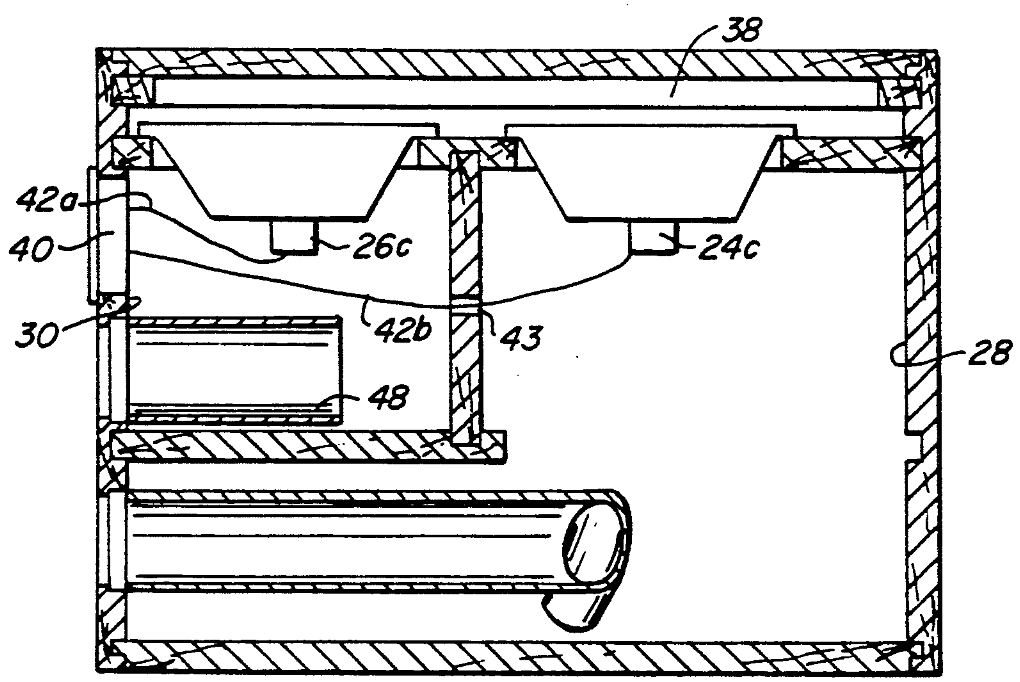
FIG. 2 is a cross-sectional view taken along line 2—2 of FIG. 1.

As depicted in FIG. 1, a speaker enclosure 10 includes four rigid sidewalls **12*a*, 12*b*, 12*c*, 12*d*, a bottom wall 14, and a top wall 16. A rigid baffle 18 is mounted spaced from the top wall 16. The baffle 18 includes first and second openings 20, 22 for receiving first and second speakers 24, 26. Each speaker 24, 26 includes a first face 24*a*, 26*a*, defined by the speaker cone, and a second face 24*b*, 26*b* adjacent the respective drivers 24*c*, 26*c*. The speakers 24, 26 are mounted in the holes 20, 22 in a fashion well known in the art. The region below the baffle 18 is divided into first and second chambers 28, 30 by a rigid wall structure 32. In the embodiment depicted in FIG. 1, the wall structure 32 includes joined first wall 34 and second wall 36. The first chamber 28 is thus defined by portions of the sidewalls 12*a*, 12*b*, 12*c*, 12*d*, the bottom wall 14, portions of the baffle 18, and the chamber walls 34, 36. The second chamber 30 is defined by portions of three of the sidewalls 12*a*, 12*c*, 12*d*, portions of the baffle 18, and the chamber walls 34, 36. A third chamber 38 lies between the baffle 18 and the rigid top wall 16, and is further defined by portions of the rigid sidewalls 12*a*, 12*b*, 12*c*, 12*d*. The respective volumes of the first, second, and third chambers 28, 30, 38 are selected for acoustic purposes, as described more thoroughly below. An electrical connector 40 mounted in a sidewall 12***d* provides for connection of signal wires (not shown) to internal wiring, as best seen in FIG. 2. Internal wiring 42*a* extends from the connector 40 to the first driver 24*c*, and wiring 42*b* extends from the connector 40, sealingly through an opening 43 in the chamber wall 34, for connection with the second driver 26*c*.

Figure 3:
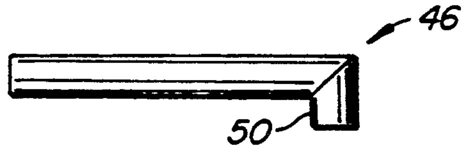
FIG. 3 is a cross-sectional view of the first port of FIG. 1.

First and second ports 46, 48 acoustically couple the first and second chambers 28, 30, respectively, to the exterior of the enclosure 10. The ports 46, 48 are generally in the form of hollow tubes. In the preferred embodiment, the first port 46 includes an angled portion 50 at its most interior end, as best depicted in FIG. 3. The angled portion 50 is necessary in some designs to place the interior end of the port at least about three inches away from any interior surface to suppress audible turbulence effects.

Figure 3A:
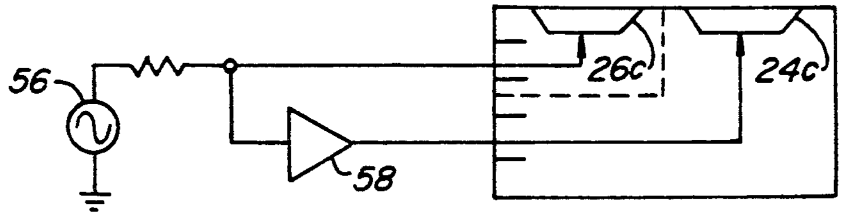
FIG. 3A is a schematic block diagram showing a signal source and a method of driving two drivers electrically out of phase.
Figure 3B:
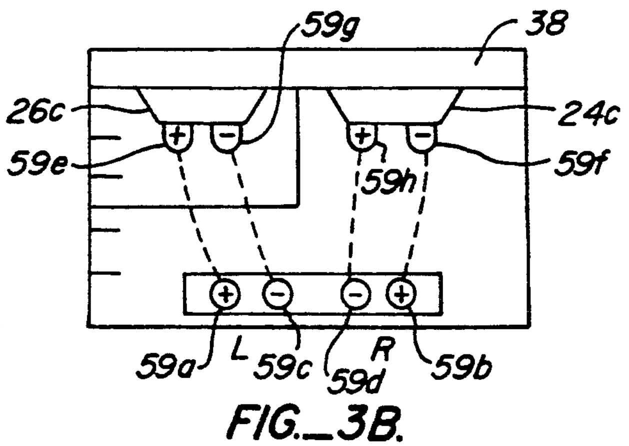
FIG. 3B is a wiring diagram of a preferred embodiment, of the subwoofer.

It is desired during operation of the speaker enclosure 10 to maintain the third chamber 38 in a substantially constant-pressure condition. For this reason, the signals controlling the drivers 24*c*, 26*c* (FIG. 3A) are configured to drive the speakers 24, 26 out of phase with respect to the third chamber 38. This means that when the first speaker cone 24*a* is moving in a direction toward the third chamber 38, the second speaker cone 26*a* is moving away from the third chamber 38. When the first speaker cone 24*a* is moving away from the third chamber 38, the second speaker cone 26*a* is moving toward the third chamber 38. Although perfection in maintaining the speakers out-of-phase is not achievable, the speakers are sufficiently out-of-phase that push-pull drive conditions are satisfied and the third chamber 38 is maintained sufficiently close to a constant-pressure to achieve the purposes of the invention, such as reducing or eliminating non-linearity of response. The signals from a source 56 which drive the speakers are treated to produce an out-of-phase relationship by any number of well known methods by use of a signal inverter 58. FIG. 3B shows the internal wiring of the subwoofer which provides the out-of-phase drive when connected to a stereo system. In FIG. 3B, the positive left and right channel input terminals 59*a*, 59*b* are connected respectively to the positive and negative terminals 59*e*, 59*f* of the two speakers 26*c*, 24*c* and the negative left and right channel input terminals 59*c*, 59*d* are connected, respectively, to the negative and positive terminals 59*g*, 59*h* of the speakers 26*c*, 24*c*.

The efficiency of the system (i.e., the proportion of electrical energy which is converted to acoustic energy) is affected by the resonant frequencies of the speaker system. The resonant frequencies are, to a great extent, determined by the relative volumes of the various chambers, particularly the relative volumes of the first and second chambers 28, 30. Preferably, the resonant frequencies are such as to produce at least first and second peaks in the impedance frequency spectrum of the speaker system in the frequency range below about 300 hz, which are spaced apart by about one to 1½ octaves. Preferably, such peaks in the impedance spectrum will have approximately equal amplitudes. The location of the particular frequencies of the impedance peaks which are most desirable will depend upon the characteristics of the other speakers in the system, such as mid-range and tweeter speakers. In one preferred embodiment, it has been found that impedance spectrum peaks can be produced at about 48 hz and 113 hz by providing the ratio of the volumes of the first and second chambers 28, 30 within a predetermined range. In a preferred embodiment, the ratio of the volume of the first chamber 28 to the volume of the second chamber 30 is no greater than about 5:1, preferably no greater than about 4.1:1. The volume of the third chamber 38 can be adjusted, within bounds. If the volume of the third chamber relative to the first chamber is too great, such as substantially in excess of the first chamber, the passband produced by the acoustic bandpass character of the speaker system becomes undesirably broadened. The subwoofer system of the present invention acts as an acoustic bandpass filter. The cut-off frequencies for the passband are affected principally by the respective resonant frequencies of the first and second ports 46, 48. The frequencies of the ports 46, 48 are directly related to the port volumes. In the preferred embodiment, the passband resides between about 40 hz and about 125 hz. It has been found that the desired frequency response is achieved when the resonant frequencies of the first and second ports are spaced apart by about one octave.

Figure 4:
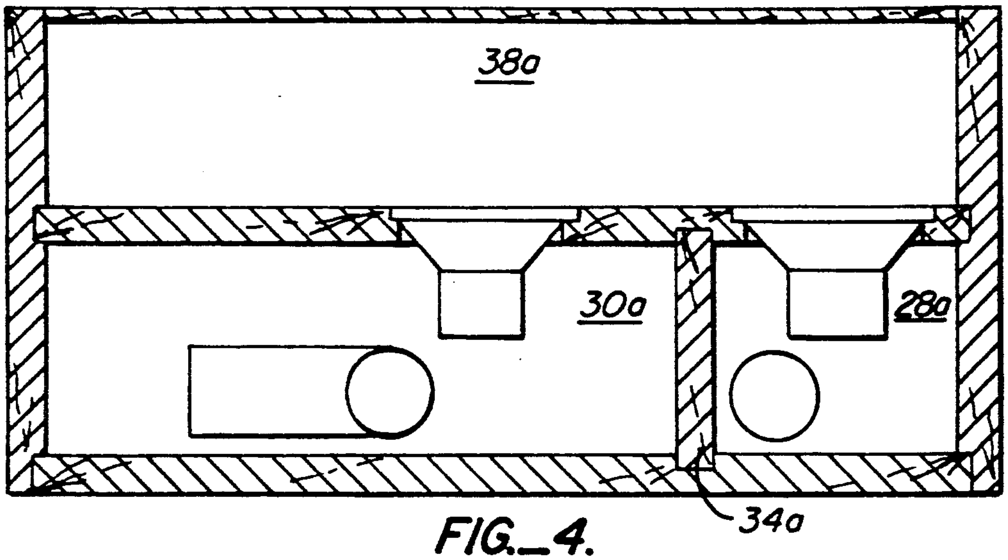
FIG. 4 is a cross-sectional view showing an alternative embodiment of the present invention.

The embodiment depicted in FIGS. 1 and 2 is one of the possible configurations of the present invention. FIGS. 4–9 depict various other configurations in accordance with the present invention. In FIG. 4, the first and second chambers 28*a*, 30*a* are positioned in a side-by-side fashion with only one common wall 34*a*.

Figure 5:
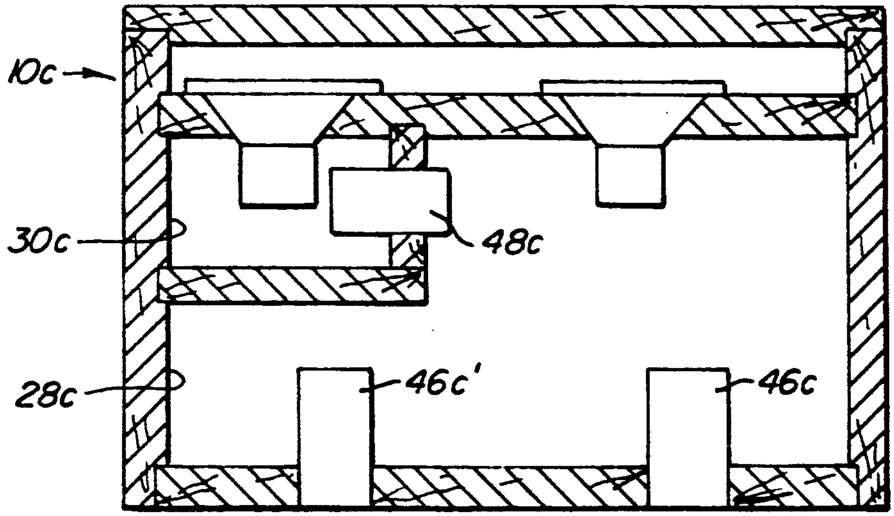
FIG. 5 is a cross-sectional view showing an alternative embodiment of the present invention.

In FIG. 5, the second chamber 30*c*, rather than being ported to the exterior of the enclosure 10*c*, is ported, via port 48*c*, to the first chamber 28*c*. The first chamber 28*c* includes two ports to the exterior 46*c*, 46*c*'.

Figure 6:
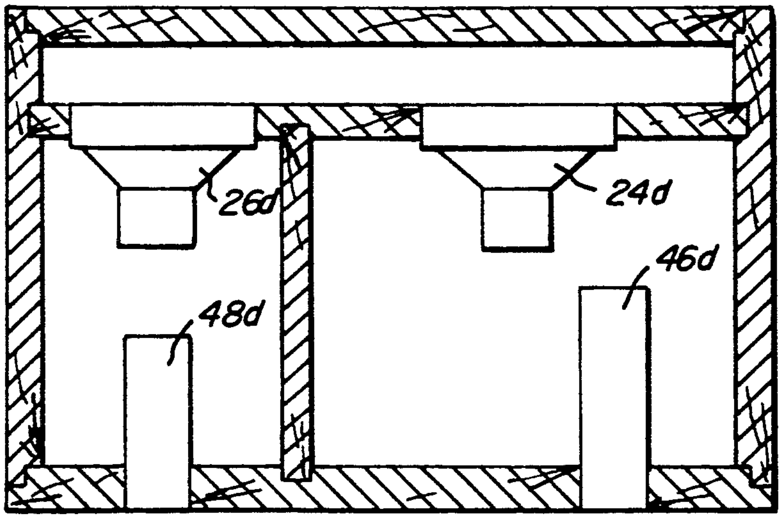
FIG. 6 is a cross-sectional view showing an alternative embodiment of the present invention.

FIG. 6 is similar to FIG. 4, except that the ports have their axes approximately parallel to the axes of the speakers 24*d*, 26*d*, rather than perpendicular as in FIG. 4.

Figure 7:
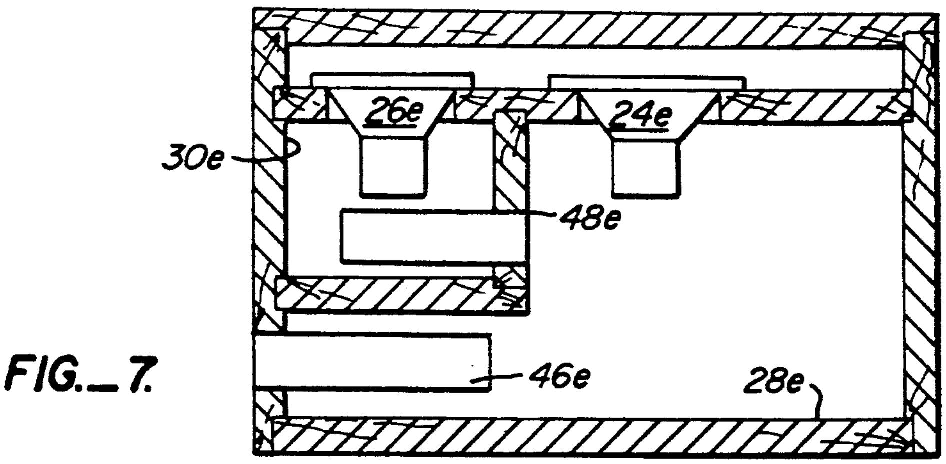
FIG. 7 is a cross-sectional view showing an alternative embodiment of the present invention.

FIG. 7 is a configuration generally similar to that of FIG. 5, except that the second chamber port 48*e* resides entirely in the second chamber 30*e*, rather than extending partially into the second chamber as in FIG. 5. Also, in FIG. 7, the second chamber 28*e* has only a single port 46*e* which is oriented perpendicular to the axes of the speakers 24*e*, 26*e*, rather than parallel as in FIG. 5.

Figure 8:
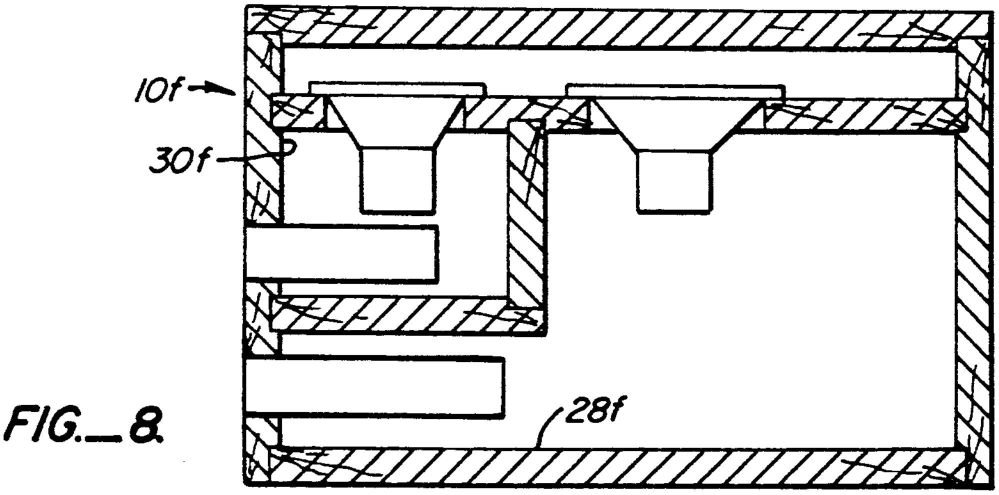
FIG. 8 is a cross-sectional view showing a preferred embodiment of the present invention; 5

FIG. 8 is similar to the configuration of FIG. 7, except that the second chamber 30*f* is ported to the exterior of the enclosure 10*f*, rather than being ported to the first chamber 28*f*.

Figure 9:
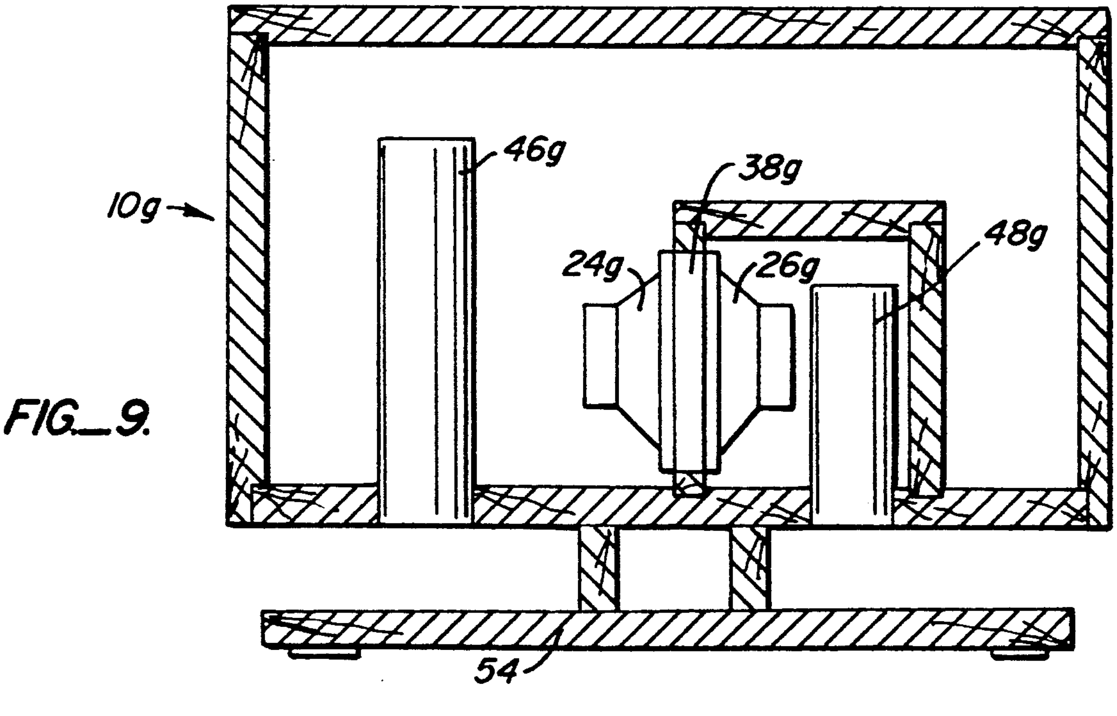
FIG. 9 is a cross-section view showing an alternative embodiment of the present invention.

In FIG. 9, the two speakers 24*g*, 26*g* are mounted so that their cone faces are adjacent, i.e., the speakers are mounted face-to-face. The area between the speakers 38*g*, including the area defined by the rigid sidewall of the hole in the baffle between the speakers, is the third chamber in this configuration. A stand 54 is provided so that the subwoofer system 10*g* can be raised off the floor to provide clearance for the ports 46*g*, 48 *g*.

Figure 10:
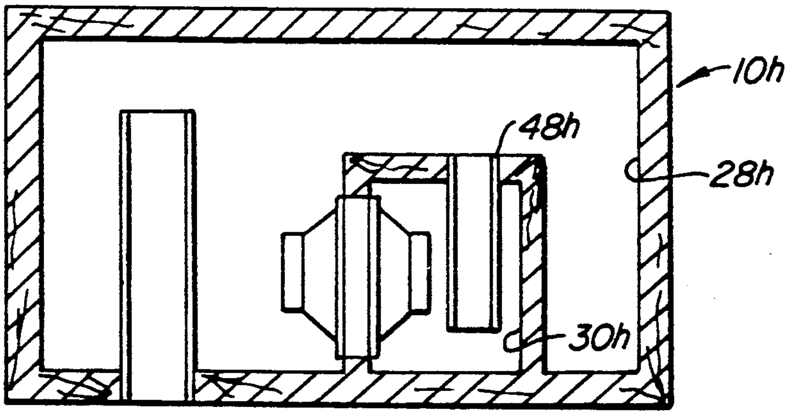
FIG. 10 is a cross-sectional view showing an alternative embodiment of the present invention.

FIG. 10 is similar to FIG. 9, except that the second chamber port 48*h* couples the second chamber 30*h* to the first chamber 28*h*, rather than to the exterior of the enclosure 10*h*.

Figure 10A:
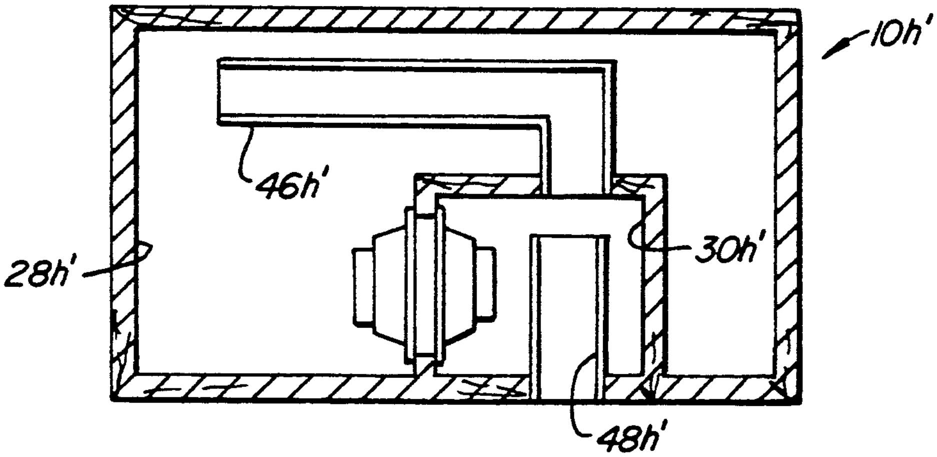

FIG. 10A is similar to FIG. 9, except that the first chamber port 46*h*' couples the first chamber 28*h*' to the second chamber 30*h*' rather than to the exterior of the enclosure 10*h*'.

Figure 11:
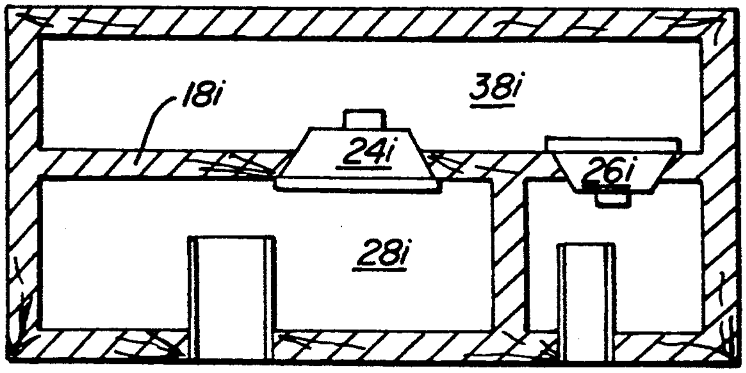
FIG. 11 is a cross-sectional view showing an alternative embodiment of the present invention.

FIG. 11 is similar to FIG. 6, except that the second speaker 26*i* is mounted so that the cone face is directed toward the first chamber 28*i*, i.e., the second speaker 26*i* is mounted, with respect to the baffle 18*i*, in a manner opposite to that of the first speaker 24*i*. In such a configuration, in order to maintain the third chamber 38*i* as a constant pressure chamber, the first and second speakers 24*i*, 26*i* will be connected in-phase.

Figure 12:
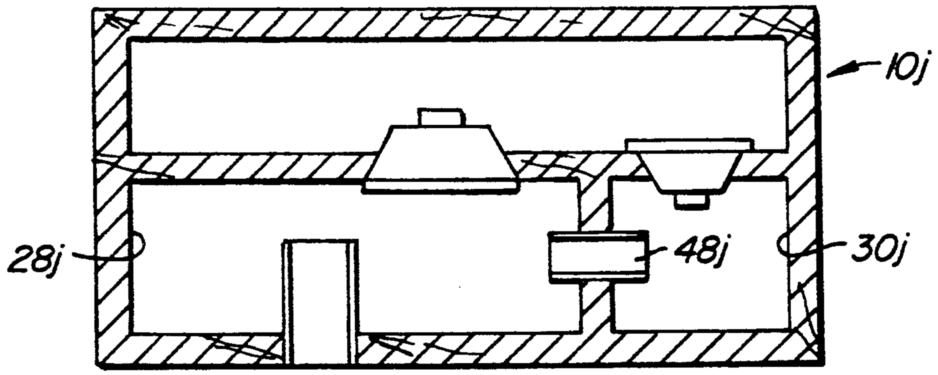
FIG. 12 is a cross-sectional view showing an alternative embodiment of the present invention.

FIG. 12 is similar to FIG. 11, except that the second chamber port 48*j* couples the second chamber 30*j* to the first chamber 28*j*, rather than to the exterior of the enclosure 10*j*.

Figure 13:
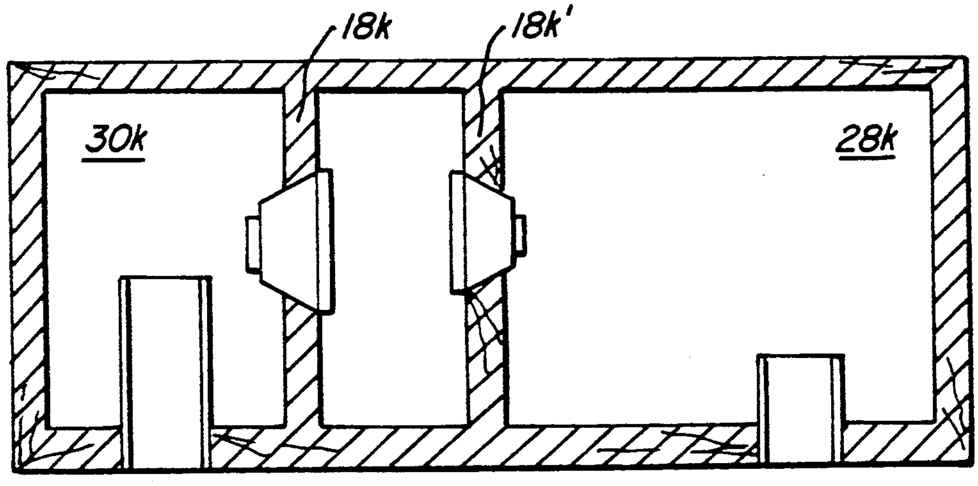
FIG. 13 is a cross-sectional view showing an alternative embodiment of the present invention.

FIG. 13 is similar to FIG. 6, except that the first and second chambers 28*k*, 30*k*, rather than being mounted on adjacent portions of one wall of the third chamber (as in FIG. 6), are mounted on two different walls of the third chamber 38*k*. This requires the provision of two baffles 18*k*, 18*k*'.

Figure 14:
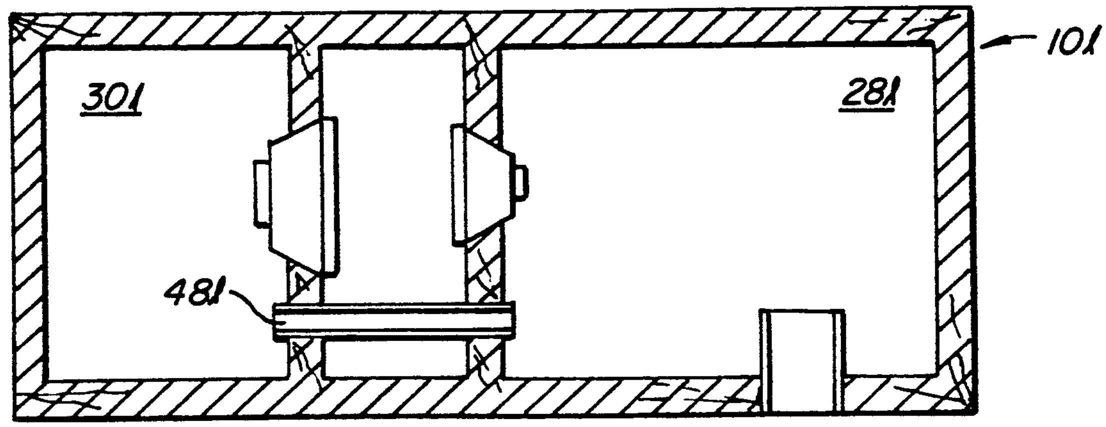
FIG. 14 is a cross-sectional view showing an alternative embodiment of the present invention.

The configuration depicted in FIG. 14 is similar to the configuration of FIG. 13, except that the second chamber 301 is ported, via port 481, to the first chamber 281, rather than to the exterior of the enclosure 101.

Figure 16A:
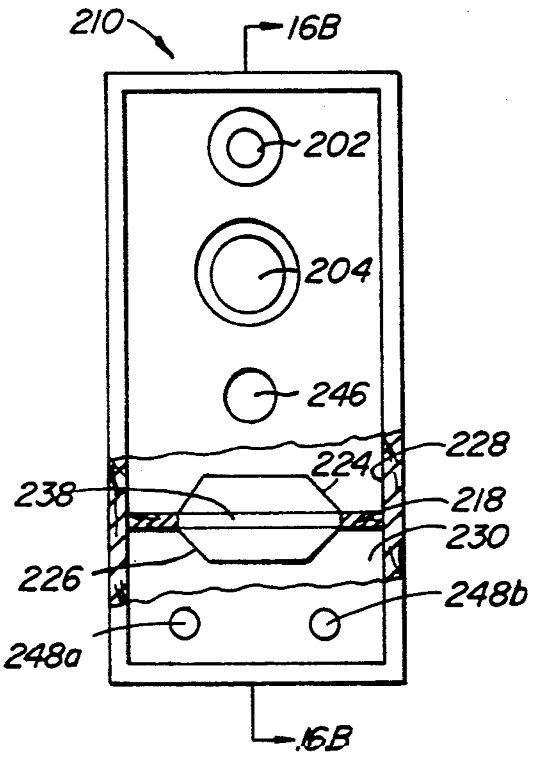
FIG. 16A is a front elevational view of a three-way full-range loudspeaker system according to one embodiment of the present invention.
Figure 16B:
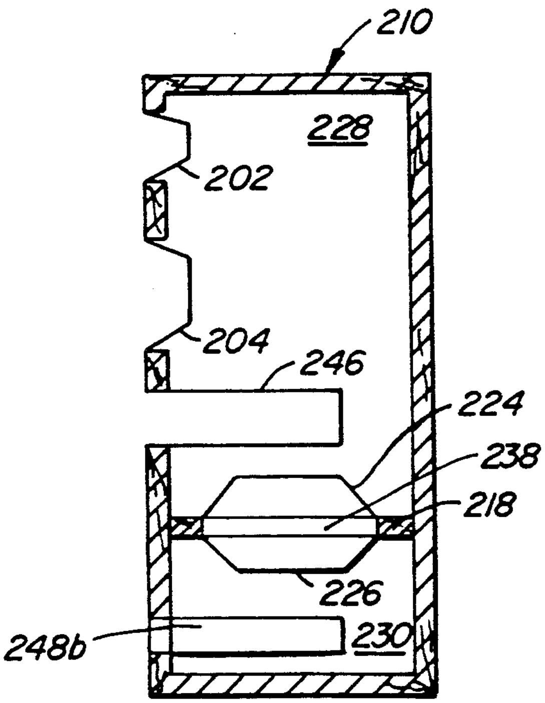
FIG. 16B is a cross-sectional view taken along line 16B—16B of FIG. 16A; 25 FIGS. 16C & D are diagrammatic representations of a series and parallel methods of connecting the woofer drivers of FIG. 16A out of phase.

FIGS. 16A and 16B depict a full-range high-fidelity speaker system according to the present invention. The depicted embodiment is a three-way speaker system including an upper range driver, such as a tweeter driver 202, and/or a mid-range driver 204, along with first and second subwoofer drivers 224, 226 mounted in an enclosure 210. The first subwoofer 224 is mounted with its back surface contacting a first chamber 228. The second subwoofer driver 226 is mounted with its back surface contacting second chamber 230. The first chamber 228 is acoustically coupled to the exterior of the enclosure 210 by a first port 246. The second chamber 230 is acoustically coupled to the exterior of the enclosure 210 by second and third ports 248*a*, 248*b*. The two subwoofer drivers 224, 226 are mounted so that their cone faces are adjacent, i.e., the speakers are mounted face-to-face on a baffle 218. The area between the speakers 238 includes the third chamber in this configuration.

Preferably, two full-range speaker systems as shown in FIGS. 16A and 16B would be used in connection with the stereo sound system, one for each channel. The tweeter and mid-range drivers are connected to the signal source in a manner well-known in the art. No electrical crossover network is required for the subwoofer drivers in the speaker system depicted in FIG. 16 as discussed above. No electrical crossover network is required when the subwoofer is used in a system with a mid-range or wide-range tweeter other than a system to block the lower frequencies from entering the midrange or tweeter drivers.

Figure 16C:
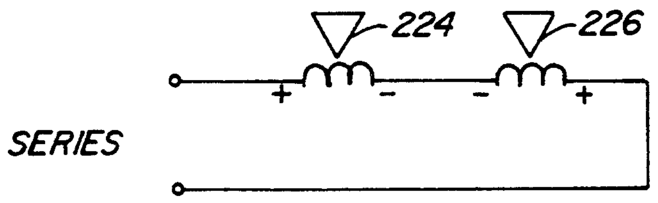
Figure 16D:
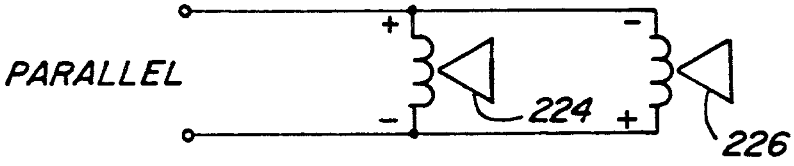

The woofer drivers are connected electrically out of phase. FIGS. 16C and 16D depict methods of connecting the woofer drivers in an out of phase fashion in series and parallel, respectively. Whether the series or parallel method is used depends on the driver impedances of all the drivers and the desired system impedance. In many current systems it is preferred to present a nominal impedance of 4 or 8 ohms to the amplifier used to drive the speakers. This impedance is complex and is a function of all the drivers in the system as well as any crossover elements.

Preferably, the relative size of the chambers 228, 230 and the volumes and resonant frequencies of the ports 246, 248*a*, 248*b* are the same as those for the corresponding elements of the stand-alone subwoofer system described above. Thus, the subwoofer portion of the three-way system has substantially the same acoustic response as the subwoofer of a stand-alone subwoofer system described above. In one preferred embodiment, the overall cabinet form of the enclosure 210 has a "tower" shape being relatively tall and narrow with a small footprint. This configuration is facilitated by the small space requirements and efficient volume distribution achieved by the face-to-face subwoofer drivers 224, 226 and dual second chamber ports 248*a*, 248*b*. As will be apparent to those skilled in the art, other subwoofer configurations and port configurations, such as those depicted in FIGS. 1 through 14 and other tweeter and mid-range driver configurations and enclosure configurations can also be used.

Figure 17:
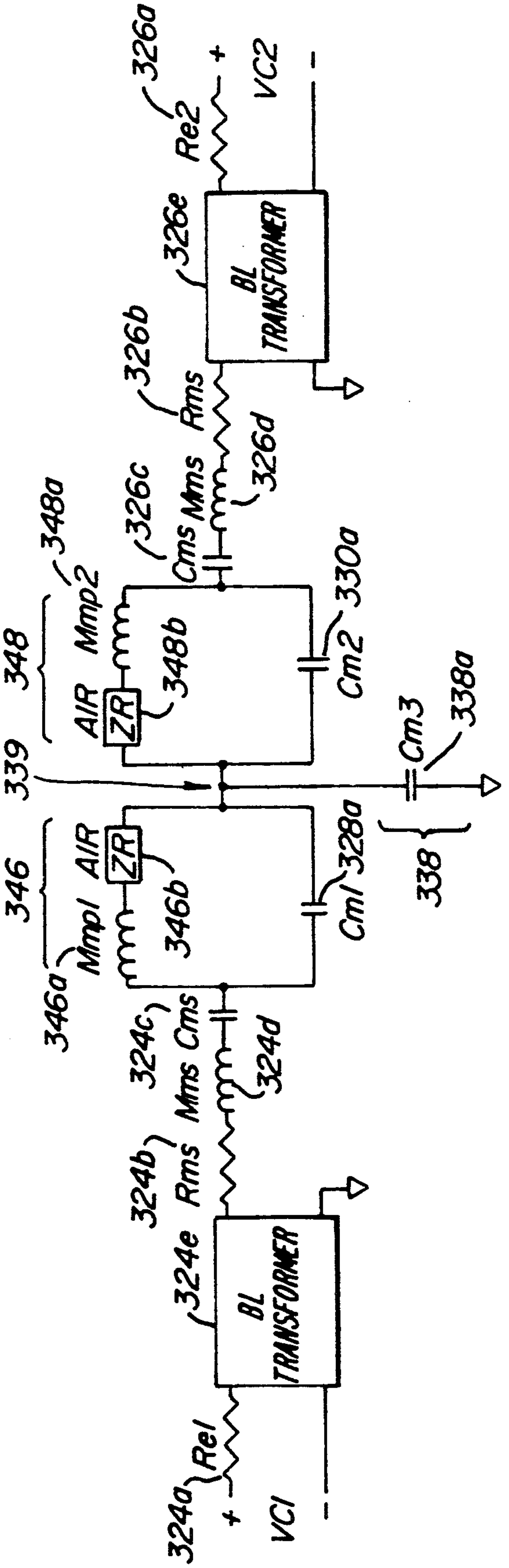
FIG. 17 is an equivalent electronic circuit model of the loudspeaker system according to an embodiment of the present invention.

FIG. 17 depicts an electronic model of a subwoofer speaker system according to the present invention. In this model, resistances Re1 and Re2, 324*a*, 326*a* represent the DC voice coil resistance of the first and second subwoofer drivers 24, 26. The resistances Rms 324*b*, 326*b* represent the mechanical damping of the drivers 24, 26. The capacitors Cms 324*c*, 326*c* represent the mechanical compliance of the drivers 24, 26. Inductors Mms 324*d*, 326*d* represent the mechanical moving mass of the drivers 24, 26. The BL transformers 324*e*, 326*e* represent the electromechanical transformation of current to force and, inversely, velocity to voltage.

As discussed above, the first and second drivers 24, 26 are acoustically coupled to the first and second ports 46, 48 and are both coupled to the third chamber 38. In FIG. 17, this relationship is shown by the coupling of the outputs from the models of each of first and second drivers 324*a*–324*e*, 326*a*–326*e* to the models of the ports 346, 348, respectively, and the coupling of the output from the models of both drivers to the model of the third chamber 338 (as depicted by the T-connection 339 in FIG. 17). The inductors Mmp 346*a*, 348*a* represent the mechanical masses of the ports 46, 48. Impedances 346*b*, 348*b* represent the air load of the ports 46, 48. The capacitors Cm1, Cm2, Cm3, 328*a*, 330*a*, 338*a*, represent the mechanical compliance of the first, second, and third chambers, 28, 30, 38.

The particular values for the components depicted in FIG. 17 will depend upon the particular embodiment of the corresponding subwoofer or speaker system. The values can be selected so as to provide the resonant frequencies and volume ratios described above. FIG. 17 illustrates, among other distinctions, that, unlike previous devices, output from the two drivers 324, 326 is coupled 339 via a common chamber 338 as well as, separately, into ported chambers 346, 348, respectively.

Referring again to the embodiment of FIGS. 1 and 2, during operation, an audio frequency electrical signal is provided to the connector 40 and transmitted through wires 42*a*, 42*b* to the speaker drivers 24*c*, 26*c*. The signal delivered to the first driver 24*c* is substantially 180° out-of-phase with the signal delivered to the second driver 26*c*. Because the movement of the cones of the speaker 24, 26 will be out-of-phase, the pressure in the third chamber 38 will remain substantially constant. The back faces of the speakers 24, 26 will alternately compress and rarify the air in the first and second chambers 28, 30, providing acoustic energy which is delivered to the exterior via the tuned ports 46, 48.

Based on the above description, a number of advantages are provided by the present invention. The subwoofer occupies a relatively small volume, yet provides favorable efficiency, response, and fidelity in bass frequencies. The subwoofer system functions as an acoustic bandpass filter so as to preferentially reproduce frequencies in a predetermined passband. Thus, the acoustic energy produced, having been effectively bandpass-filtered, will have a frequency distribution different from that of the electrical driving signal. Because of the bandpass characteristics of the subwoofer, electronic devices for providing a particular frequency band to the subwoofer, i.e.. a crossover network, are not needed. The constant-pressure chamber serves to reduce or minimize non-linear responses of the speakers. This feature is particularly useful where, as is common, the two speakers have slightly different response characteristics, typically owing to imperfections in the manufacturing process. As a result of the constant-pressure chamber, the non-linear excursions which would otherwise result from such manufacturing differences are substantially canceled out, and the resultant signal is substantially smoothed, i.e., free from such undesirable excursions.

The present invention can be used to receive a stereo signal and output a mono-subwoofer signal. The subwoofer of the present invention operates in a fashion which substantially sums the two signals from a stereo input. Typically, however, stereo signals below about 200–300 hz tend to be substantially identical. Therefore, the present subwoofer provides a summed signal below about 200–300 hz, while the stereo signals above about 300 hz are substantially out of the passband of the subwoofer.

Experimental

A subwoofer system substantially as illustrated in FIGS. 1, 2, 3, and 8 was constructed and tested. The tested embodiment used two identical woofers with a nominal diameter of 6.5 inches. The total interior volume of the enclosure was approximately 0.7 cu. ft. and the ratio of the volumes of the two tuned chambers was approximately 3.0:1.

Figure 15A:
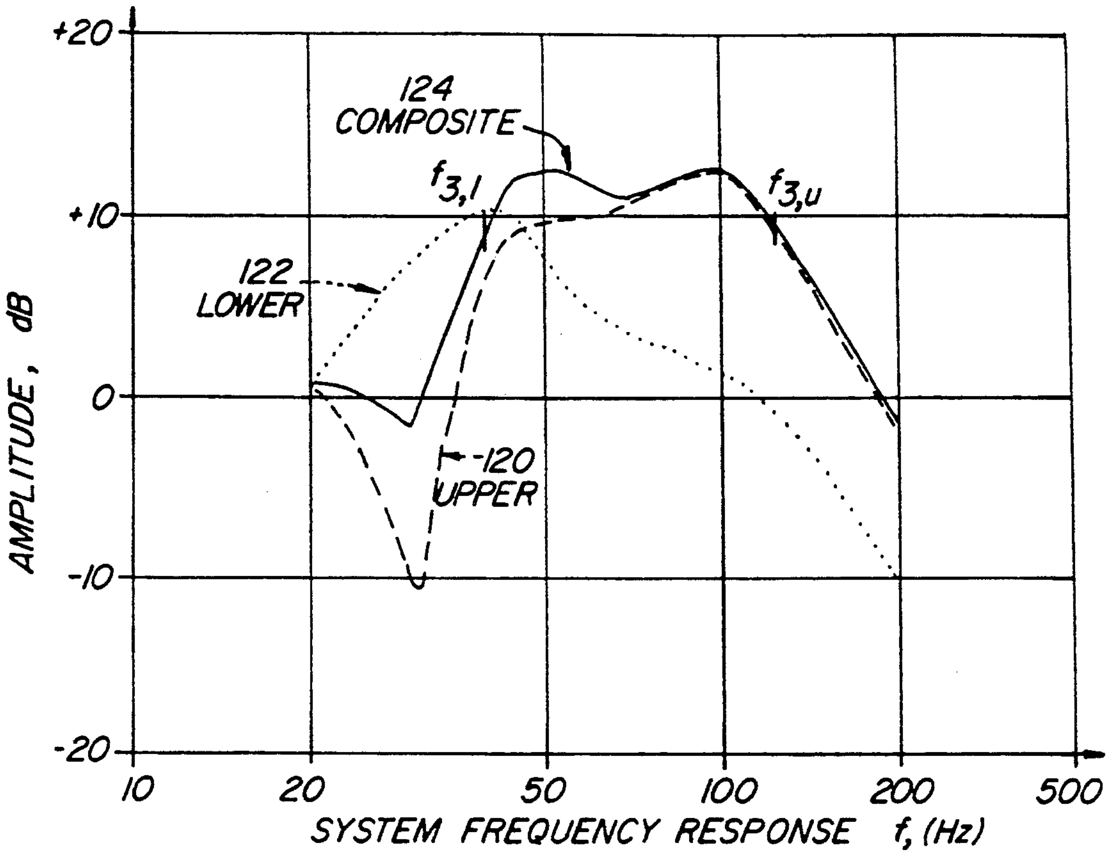
FIGS. 15A and B summarize frequency response measurements and impedance data.
Figure 15B:
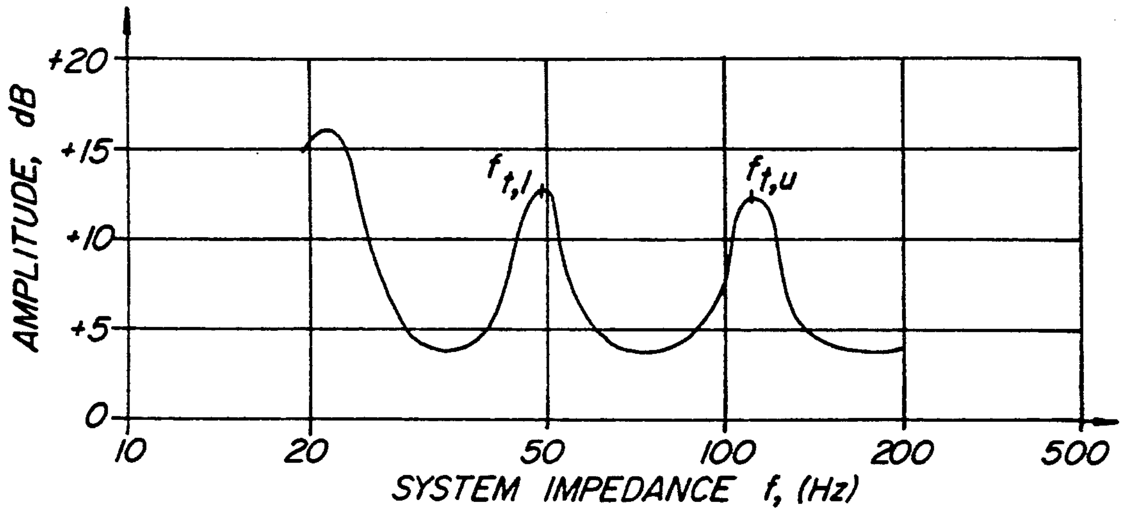
FIG. 15C illustrates the measurement set up.
Figure 15C:
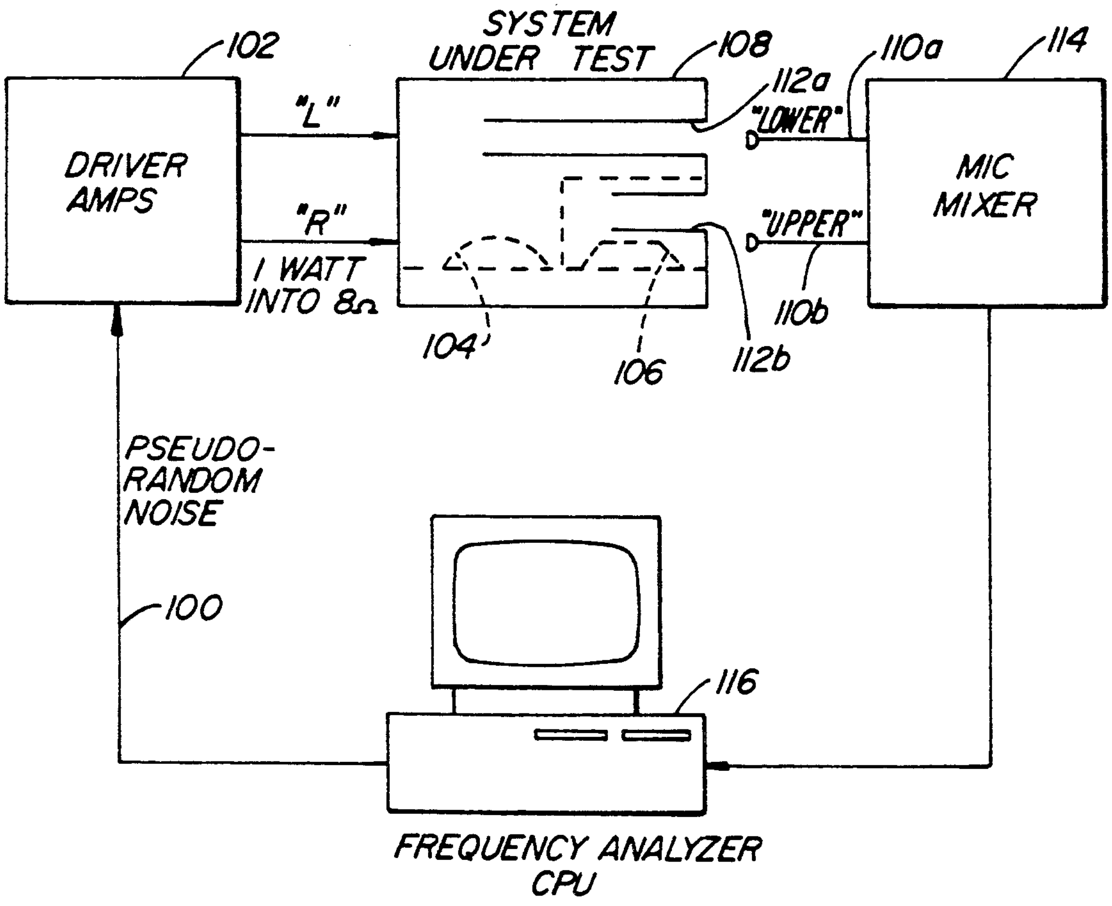

A block diagram of the measurement setup is shown in FIG. 15C. A pseudo-random noise test signal 100 was amplified 102 and provided at the input terminals of the speakers 104, 106 housed in an enclosure 108 as described. The output was sensed by microphones **110*a*, 110*b* positioned near the output of each port 112*a*, 112*b*. The acoustic response thus obtained was sent through a mixer 114 and processed by a frequency analyzer 116** consisting of a desktop computer controlled by software.

FIGS. 15A and B, record the performance of this embodiment of the present invention. The Frequency Response plots of FIG. 15A and the Impedance Magnitude plots of FIG. 15B display data obtained by the well-known Maximum Length Sequential (MLS) method. The frequency response plots of FIG. 15A show the individual responses 120, 122 of each port **112*a*, 112*b* and the composite system response 124. The composite plot 124** shows the resulting bandpass characteristic.

Discussion of the design procedure for a subwoofer according to the present invention will aid the interpretation of FIGS. 15A and 15B. The first step involves specifying subwoofer bandpass response which is desired in order for the subwoofer to correspond to or complement the satellite speakers to be used with the subwoofer or the midrange and tweeter drivers to be used in a full-range system. This specification will include the subwoofer system upper and lower cutoff frequencies and the desired acoustic output within the passband. Major system parameters such as enclosure volume, efficiency,. drive size, response, and power-handling ability are then determined. In one case, for an enclosure volume of about 0.8 ft.$^3$ and a band pass of 40 to 120 Hz. a pair of 6.5 in. woofers were chosen and a beginning ratio of approximately 4:1 was selected for the ratio of the larger chamber volume to the smaller chamber volume. As expected, these specifications underwent some adjustment via iteration during the measurement process.

In the second step, the port length of the upper (smaller) chamber is adjusted to maximize the port output in the frequency region just below the desired upper cutoff frequency. Similarly in step three the port length of the lower (larger) chamber is adjusted to maximize its port output in the frequency region just above the lower frequency cutoff. The Impedance v. Frequency plot in FIG. 15B shows the frequencies to which the two chambers are tuned. The upper chamber is tuned to a frequency of $f_{t,u}$ of 113 Hz. and the lower chamber is tuned to a frequency of $f_{t,l}$ of 48 Hz. The resulting bandpass for this system extends from about 40 Hz. ($f_{3,l}$) to about 125 Hz. ($f_{3,u}$) as shown in the composite response in FIG. 15A. This bandpass is close to the design objective. In a subwoofer made according to the present invention, the upper and lower chambers are tuned apart, preferably about an octave to an octave-and-a-half apart, with the upper and lower cutoff frequencies respectively somewhat above and below the chamber/-port tuning frequencies. A final step consists of listening to the subwoofer in combination with the intended mid-range and tweeter speakers, and making any adjustments needed to obtain the desired balance in their sound.

The data of FIG. 15 record the performance of the improved subwoofer of reduced size and greater efficiency which does not require an electrical crossover network as compared with the previous designs. The further objectives of reduced distortion and simplified connection to a stereo sound reproduction system are also met because of the push-pull operation provided by the third chamber which acoustically couples the two loudspeaker drivers driven out-of-phase by the stereo signals.

As will be apparent to those skilled in the art, a number of variations and modifications of the described invention can also be used. Port shapes other than round ports can be used, such as square, rectangular, and the like. A single port can be replaced by two or more smaller ports. The invention can be used in connection with more than two speakers and/or more than three chambers. The absolute and relative sizes of the chambers and enclosure can be adjusted, particularly as needed to adjust the frequency response in coordination with the characteristics of other speakers, such as mid-range or tweeter speakers. Although standard conical speakers are depicted, other shapes of speakers can be used, such as elliptical, planar, and the like. In general, any of the configurations depicted as being series-tuned (i.e., with the second chamber ported to the first chamber and the first chamber ported to the exterior) can also be provided in a parallel-tuned configuration (i.e., with the first and second chambers ported to the exterior). One or more of the chambers can be provided with a sound-absorbing curtain or other non-rigid material for absorbing unwanted frequencies.

Although the invention has been described by way of a preferred embodiment and various modifications and variations, other modifications and variations can also be used within the scope of the invention, the invention being defined by the appended claims and equivalents thereof.

What is claimed is:

1. A speaker apparatus for providing acoustic energy comprising:

an enclosure having walls defining an interior of the enclosure and an exterior of the enclosure, and which includes first, second, and third chambers;

a first drivable speaker acoustically coupling said first chamber with said third chamber;

a second drivable speaker acoustically coupling said second chamber with said third chamber;

a first port acoustically coupling said first chamber to the exterior of said enclosure; and a second port acoustically coupling said second chamber to one of said first chamber and the exterior of said enclosure.

2. Apparatus, as claimed in claim 1, further comprising means for driving said first and second speakers substantially acoustically out-of-phase with respect to said third chamber.

3. Apparatus, as claimed in claim 1, wherein said third chamber is maintained at a substantially constant pressure when said first and second speakers are driven.

4. Apparatus, as claimed in claim 1, further comprising:

means for providing first and second channels of a stereo signal to said enclosure; and means, coupled to said means for providing and to said first and second drivable speakers, for providing acoustic summing of said first and second channels of said stereo signal.

5. Apparatus, as claimed in claim 1, wherein each of said first and second chambers has a volume, defining a ratio of said first chamber volume to said second chamber volume and wherein the ratio of the volume of said first chamber to the volume of said second chamber is less than about 5:1.

6. Apparatus, as claimed in claim 1, further comprising means for coupling said first, second and third chambers, and said first and second ports to substantially define an effective passband of frequencies for said acoustic energy.

7. Apparatus, as claimed in claim 6, wherein said passband includes frequencies between about 30 hz and about 300 hz.

8. Apparatus, as claimed in claim 1, further comprising means for providing an electric signal to each of said first and second drivable speakers.

9. Apparatus, as claimed in claim 8, wherein said electric signal has a first effective frequency distribution, and further comprising means, coupled to said means for providing an electric signal, for producing a second frequency distribution for said acoustic energy.

10. Apparatus, as claimed in claim 1, further comprising at least a first rigid wall between said third chamber and at least one of said first and second chambers.

11. Apparatus, as claimed in claim 1, wherein said enclosure includes a plurality of ports, said plurality of ports including at least said first port and said second port and wherein none of said plurality of ports acoustically couples said third chamber with said exterior of said enclosure.

12. A speaker apparatus for providing acoustic energy, comprising:

an enclosure having walls which separate an enclosure interior from the exterior of said enclosure and which includes first, second, and third chambers;

a first drivable speaker acoustically coupling said first chamber with said third chamber;

a second drivable speaker acoustically coupling said second chamber with said third chamber;

a first port acoustically coupling said first chamber to the exterior of said enclosure; and a second port acoustically coupling said second chamber to one of said first chamber and the exterior of said enclosure, said first and second ports each having a resonant frequency, the respective resonant frequencies of said first and second ports spaced about one octave apart.

13. A speaker apparatus for providing acoustic energy comprising:

an enclosure having walls of defining an interior of the enclosure and an exterior of the enclosure and which includes first, second, and third chambers, said enclosure occupying a volume less than about one cubic foot;

a first drivable speaker acoustically coupling said first chamber with said third chamber;

a second drivable speaker acoustically coupling said second chamber with said third chamber;

a first port acoustically coupling said first chamber to the exterior said enclosure; and a second port acoustically coupling said second chamber to one of said first chamber and the exterior of said enclosure.

14. A speaker apparatus for providing acoustic energy, comprising:

an enclosure having walls defining an enclosure interior and the exterior of said enclosure and containing an internal baffle defining first and second chambers in said enclosure, said baffle having a hole;

first and second drivable speakers, each having a cone face and a driver face, said cone faces of said speakers mounted on opposite sides of said baffle, adjacent said hole, to define a space between said respective cone faces;

a first port acoustically coupling said first chamber to the exterior of said enclosure; and a second port acoustically coupling said second chamber to one of said first chamber and the exterior of said enclosure.

15. Apparatus, as claimed in claim 14, wherein said space between said cone faces is non-ported with respect to the exterior of said enclosure.

16. Apparatus, as claimed in claim 14, further comprising means for driving said first and second speakers substantially acoustically out-of-phase.

17. Apparatus, as claimed in claim 14, further comprising:

means for providing first and second channels of a stereo signal to said enclosure; and means, coupled to said means for providing and to said first and second drivable speakers, for providing acoustic summing of said first and second channels of said stereo signal.

18. A speaker apparatus for providing acoustic energy, comprising:

an enclosure which includes first, second, and third chambers;

a first drivable speaker acoustically coupling said first chamber with said third chamber;

a second drivable speaker acoustically coupling said second chamber with said third chamber; and means, coupled to said first and second drivable speakers, for maintaining said third chamber in a substantially constant-pressure state while said first and second drivable speakers are driven.

19. Apparatus, as claimed in claim 18, wherein said means for maintaining includes means for driving said first and second drivable speakers.

20. Apparatus, as claimed in claim 18, wherein said enclosure includes walls defining an interior of the enclosure and an exterior of the enclosure and further comprising means for acoustically coupling said first chamber to the exterior of said enclosure.

21. Apparatus, as claimed in claim 20, wherein said means for acoustically coupling includes at least one port extending between said first chamber and the exterior of said enclosure.

22. Apparatus, as claimed in claim 20, further comprising means for acoustically coupling said second chamber to one of said first chamber and the exterior of said enclosure.

23. Apparatus, as claimed in claim 22, wherein said means for coupling includes at least one port extending between said second chamber and one of said first chamber and the exterior of said enclosure.

24. A method for producing acoustic energy corresponding to an electric signal, comprising:

providing an enclosure which includes first, second, and third chambers;

acoustically coupling said first chamber with said third chamber using a first drivable speaker;

acoustically coupling said second chamber with said third chamber using a second drivable speaker;

driving said first and second speakers using said electric signal; and maintaining said third chamber in a substantially constant-pressure state during said step of driving said first and second speakers.

25. A method, for producing acoustic energy corresponding to an electric signal, comprising:

providing an enclosure which includes first, second, and third chambers;

acoustically coupling said first chamber with said third chamber using a first drivable speaker;

acoustically coupling said second chamber with said third chamber using a second drivable speaker;

driving said first and second speakers using said electric signal; and maintaining said third chamber in a substantially constant-pressure state during said step of driving said first and second speakers by driving said second speaker to be out-of-phase with said first speaker.

26. A method, as claimed in claim 24, wherein said enclosure includes walls defining an interior of the enclosure and an exterior of the enclosure and further comprising acoustically coupling said first chamber to the exterior of said enclosure.

27. A method, as claimed in claim 24, wherein said enclosure includes walls defining an interior of the enclosure and an exterior of the enclosure and further comprising acoustically coupling said second chamber to one of said first chambers and the exterior of said enclosure.

28. A method, as claimed in claim 24, further comprising coupling said first, second, and third chambers to substantially define an effective passband of frequencies for said acoustic energy.

29. A method, as claimed in claim 24, further comprising:

providing first and second channels of a stereo signal to said enclosure; and acoustically summing said first and second channels of said stereo signal.

30. A speaker apparatus for providing acoustic energy, comprising:

an enclosure which includes defining an interior of the enclosure and an exterior of the enclosure and which includes first, second, and third chambers;

a first drivable subwoofer speaker acoustically coupling said first chamber with said third chamber;

a second drivable subwoofer speaker acoustically coupling said second chamber with said third chamber;

at least a third upper-range speaker mounted in said enclosure;

a first port acoustically coupling said first chamber to the exterior of said enclosure; and a second port acoustically coupling said second chamber to one of said first chamber and the exterior of said enclosure.

31. A speaker apparatus, as claimed in claim 30, wherein said speaker apparatus includes at least a first tweeter driver and a first mid-range driver.

32. A speaker apparatus, as claimed in claim 30, further comprising a third port acoustically coupling one of said first chamber and said second chamber to the exterior of said enclosure.

33. A speaker apparatus, as claimed in claim 30, wherein said first and second drivable subwoofer speakers each have a cone face and a driver face, said cone face of said first drivable subwoofer speaker and said cone face of said second drivable subwoofer speaker mounted so as to face one another to define a space between said respective cone faces, said space comprising said third chamber.

34. Apparatus, as claim in claim 30, further comprising means for driving said first and second subwoofer speaker.

* * * * *